(12) United States Patent
Hu et al.

(10) Patent No.: US 12,477,879 B2
(45) Date of Patent: Nov. 18, 2025

(54) WAFER-LEVEL FULL-COLOR DISPLAY DEVICE AND METHOD FOR MANUFACTURING THE SAME

(71) Applicant: HARVATEK CORPORATION, Hsinchu (TW)

(72) Inventors: Yu-Chang Hu, Hsinchu (TW); Bo-Ren Lin, Hsinchu (TW); Hsin-I Lu, Hsinchu County (TW); Shyi-Ming Pan, Miaoli County (TW); Feng-Hui Chuang, New Taipei (TW)

(73) Assignee: HARVATEK CORPORATION, Hsinchu (TW)

( * ) Notice: Subject to any disclaimer, the term of this patent is extended or adjusted under 35 U.S.C. 154(b) by 377 days.

(21) Appl. No.: 18/218,614

(22) Filed: Jul. 6, 2023

(65) Prior Publication Data

US 2024/0014364 A1 Jan. 11, 2024

(30) Foreign Application Priority Data

Jul. 8, 2022 (TW) .................................. 111125725

(51) Int. Cl.
*H10H 20/857* (2025.01)
*H01L 25/075* (2006.01)
*H10H 20/01* (2025.01)
*H10H 29/14* (2025.01)

(52) U.S. Cl.
CPC ....... *H10H 20/857* (2025.01); *H01L 25/0753* (2013.01); *H10H 29/142* (2025.01); *H10H 20/0364* (2025.01)

(58) Field of Classification Search
CPC ............... H10H 20/857; H10H 29/142; H10H 20/0364; H01L 25/0753; H01L 25/167
See application file for complete search history.

(56) References Cited

U.S. PATENT DOCUMENTS

| | | | | |
|---|---|---|---|---|
| 9,627,580 | B2 * | 4/2017 | Liao | H01L 21/0259 |
| 10,128,308 | B1 * | 11/2018 | Shin | H10H 29/142 |
| 10,586,893 | B2 * | 3/2020 | Kang | H10H 20/816 |
| 11,183,537 | B2 * | 11/2021 | Liao | H01L 25/167 |
| 11,594,663 | B2 * | 2/2023 | Kim | H10H 29/142 |
| 12,313,925 | B2 * | 5/2025 | Liao | G02F 1/133603 |
| 2007/0080360 | A1 * | 4/2007 | Mirsky | H10H 20/858 |
| | | | | 257/706 |

(Continued)

FOREIGN PATENT DOCUMENTS

TW M608203 U 2/2021
TW 202209503 A 3/2022

*Primary Examiner* — Grant Sitta
(74) *Attorney, Agent, or Firm* — Li & Cai Intellectual Property (USA) Office

(57) ABSTRACT

A wafer-level full-color display device and a method for manufacturing the same are provided. In the method, a plurality of LED structures arranged into an array and a peripheral electrode layer surrounding the LED structures are formed on a front side of a wafer substrate. Next, one or more insulating layers are formed to flatten the stepped difference of each of the LED structures and fill up the height difference between the LED structures and the wafer substrate. Afterwards, conductive lines are formed on the one or more insulating layers to provide a reliable electrical connection between the LED structures and the peripheral electrode layer.

20 Claims, 14 Drawing Sheets

(56) References Cited

U.S. PATENT DOCUMENTS

| | | | |
|---|---|---|---|
| 2007/0082457 A1* | 4/2007 | Chou | H01L 21/7684 257/E21.583 |
| 2014/0131760 A1* | 5/2014 | Chen | H10H 20/831 257/99 |
| 2017/0117257 A1* | 4/2017 | Lee | H10H 20/831 |
| 2019/0044023 A1* | 2/2019 | Cheng | H10H 20/01 |
| 2019/0229149 A1* | 7/2019 | Yoo | H10H 29/142 |
| 2019/0295996 A1* | 9/2019 | Park | H01L 25/0753 |
| 2019/0319020 A1* | 10/2019 | Pan | H01L 24/83 |
| 2019/0319065 A1* | 10/2019 | Daikoku | H10H 20/841 |
| 2020/0335677 A1* | 10/2020 | Ohashi | H01L 25/0753 |
| 2020/0343230 A1* | 10/2020 | Sizov | H01L 25/18 |
| 2020/0350477 A1* | 11/2020 | Shim | H10H 20/8312 |
| 2021/0005794 A1* | 1/2021 | Sakong | H10H 20/851 |
| 2021/0091259 A1* | 3/2021 | John | H10H 20/857 |
| 2021/0111325 A1* | 4/2021 | Kim | H10H 20/833 |
| 2021/0118945 A1* | 4/2021 | Liao | H10H 20/857 |
| 2022/0045242 A1* | 2/2022 | Ikeda | H10H 20/857 |
| 2022/0093577 A1* | 3/2022 | Lin | H01L 25/167 |
| 2022/0093578 A1* | 3/2022 | Lin | H01L 25/162 |
| 2022/0246799 A1* | 8/2022 | Chen | H10H 20/8312 |
| 2022/0352248 A1* | 11/2022 | Kim | H10H 20/851 |
| 2023/0059512 A1* | 2/2023 | Chen | H10H 20/01 |
| 2023/0103358 A1* | 4/2023 | An | H10H 20/01 438/26 |
| 2023/0307593 A1* | 9/2023 | Boutami | H10H 29/14 |
| 2023/0378142 A1* | 11/2023 | Huang | H01L 25/0753 |
| 2023/0420630 A1* | 12/2023 | Akimoto | H10D 86/441 |
| 2024/0014364 A1* | 1/2024 | Hu | H01L 25/0753 |
| 2024/0063340 A1* | 2/2024 | Keller | H10H 29/142 |
| 2024/0065069 A1* | 2/2024 | Park | H10K 59/38 |
| 2024/0154064 A1* | 5/2024 | Kim | H10H 20/812 |
| 2024/0413274 A1* | 12/2024 | Li | H10H 29/0361 |
| 2025/0006871 A1* | 1/2025 | Hu | H10H 29/842 |
| 2025/0107253 A1* | 3/2025 | Liu | H10F 39/107 |
| 2025/0140767 A1* | 5/2025 | Park | H10H 20/831 |
| 2025/0221128 A1* | 7/2025 | Katkar | H10H 29/39 |

\* cited by examiner

WAFER-LEVEL FULL-COLOR DISPLAY DEVICE AND METHOD FOR MANUFACTURING THE SAME

CROSS-REFERENCE TO RELATED PATENT APPLICATION

This application claims the benefit of priority to Taiwan Patent Application No. 111125725, filed on Jul. 8, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a full-color display device and a method for manufacturing the same, and more particularly to a wafer-level full-color display device with LEDs that are disposed without transferring and a method for manufacturing the same.

BACKGROUND OF THE DISCLOSURE

Light emitting diodes (LEDs) have been widely used for their good lighting quality and high light-emitting efficiency. Display devices using LEDs as light emitting elements can have better color performance compared to those using traditional light sources. For example, red, green and blue (RGB) LEDs are used in a full-color LED display device for color matching. The full-color LED display device can be used to exhibit any information by using the RGB LEDs to produce red, green and blue lights that can be mixed to emit any color of light.

There is still a lot of room for improvement in manufacturing of the full-color LED display device. Specifically, an LED element generally includes a P-type semiconductor epitaxial layer, an N-type semiconductor epitaxial layer, and an active layer (i.e., light emitting layer) between the P-type and N-type semiconductor epitaxial layers. In a process of forming conductive lines on a wafer substrate, the conductive lines are required to climb up, down, and across the P-type and N-type semiconductor epitaxial layers along the surfaces of the wafer substrate, such as a sapphire wafer substrate. That is, the conductive lines have to climb over a height difference of several microns. As a result, the conductive lines are not easily made into a circuit without breaking, which may cause an open circuit of an entire row of LEDs. Therefore, much research has been dedicated to improving upon the above-mentioned technical inadequacies, so as to broaden commercial applications of the full-color LED display device.

SUMMARY OF THE DISCLOSURE

In response to the above-referenced technical inadequacy, the present disclosure provides a wafer-level full-color display device with LEDs and a method for manufacturing the same, which has high process flexibility to realize different circuit configurations, and can increase the yield and reliability of products.

In order to solve the above-mentioned problems, one of the technical aspects adopted by the present disclosure is to provide a method for manufacturing a wafer-level full-color display device, including: providing a wafer substrate having a front side and a back side; forming an LED array on the front side of the wafer substrate, the LED array including a plurality of LED structures, in which two or more of the LED structures that are in a same row are alternately arranged with a plurality of first trenches, two or more of the LED structures that are in a same column are alternately arranged with a plurality of second trenches, and each of the LED structures includes a first conductive structure, a light emitting layer, and a second conductive structure that are arranged from bottom to top; forming a first insulating layer to fill the first trenches and the second trenches, in which the first insulating layer and the first conductive structures of the LED structures jointly form a first leveling layer on the front side of the wafer substrate; forming a first circuit layer on the first leveling layer, the first circuit layer being electrically connected to the first conductive structures of the LED structures; forming a second insulating layer over the first circuit layer, in which the second insulating layer and the second conductive structures of the LED structures jointly form a second leveling layer on the front side of the wafer substrate; and forming a second circuit layer on the second leveling layer, the second circuit layer being electrically connected to the second conductive structures of the LED structures.

In order to solve the above-mentioned problems, another one of the technical aspects adopted by the present disclosure is to provide a wafer-level full-color display device, including a wafer substrate, an LED array, a first insulating layer, a first circuit layer, a second insulating layer, and a second circuit layer. The wafer substrate has a front side and a back side. The LED array is disposed on the front side of the wafer substrate and includes a plurality of LED structures. Two or more of the LED structures that are in a same row are alternately arranged with a plurality of first trenches, and two or more of the LED structures that are in a same column are alternately arranged with a plurality of second trenches. Each of the LED structures includes a first conductive structure, a light emitting layer, and a second conductive structure that are arranged from bottom to top. The first insulating layer is filled in the first trenches and the second trenches. The first insulating layer and the first conductive structures of the LED structures jointly form a first leveling layer on the front side of the wafer substrate. The first circuit layer is disposed on the first leveling layer and electrically connected to the first conductive structures of the LED structures. The second insulating layer is disposed over the first circuit layer. The second insulating layer and the second conductive structures of the LED structures jointly form a second leveling layer on the front side of the wafer substrate. The second circuit layer is disposed on the second leveling layer and electrically connected to the second conductive structures of the LED structures.

Therefore, in the wafer-level full-color display device and the method for manufacturing the same provided by the present disclosure, by virtue of "a first insulating layer being formed to fill in trenches (e.g., longitudinal and transversal trenches) between LED structures, so as to form a first leveling layer on a front side of a wafer substrate," "a first circuit layer being arranged on the first leveling layer," "a second insulating layer being formed over the first circuit layer, so as to form a second leveling layer on the front side of the wafer substrate," and "a second circuit layer being arranged on the second leveling layer," the stepped difference of each of the LED structure can be leveled and the height difference between the LED structures and the wafer substrate can be filled up, so as to prevent conductive lines from being broken due to climbing, thereby increasing the yield and reliability of products (i.e., wafer-level full-color display devices manufactured by the method).

The method for manufacturing the wafer-level full-color display device of the present disclosure can select either of the conductive lines of the first circuit layer or the second circuit layer (i.e., the lines connected to the first conductive structures or the second conductive structures) to serve as signal lines, thereby having high flexibility in circuit design and configuration. Furthermore, the method for manufacturing the wafer-level full-color display device of the present disclosure can omit one or more steps required for transferring the LED structures, and is thus advantageous for reducing production costs and increasing production efficiency.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
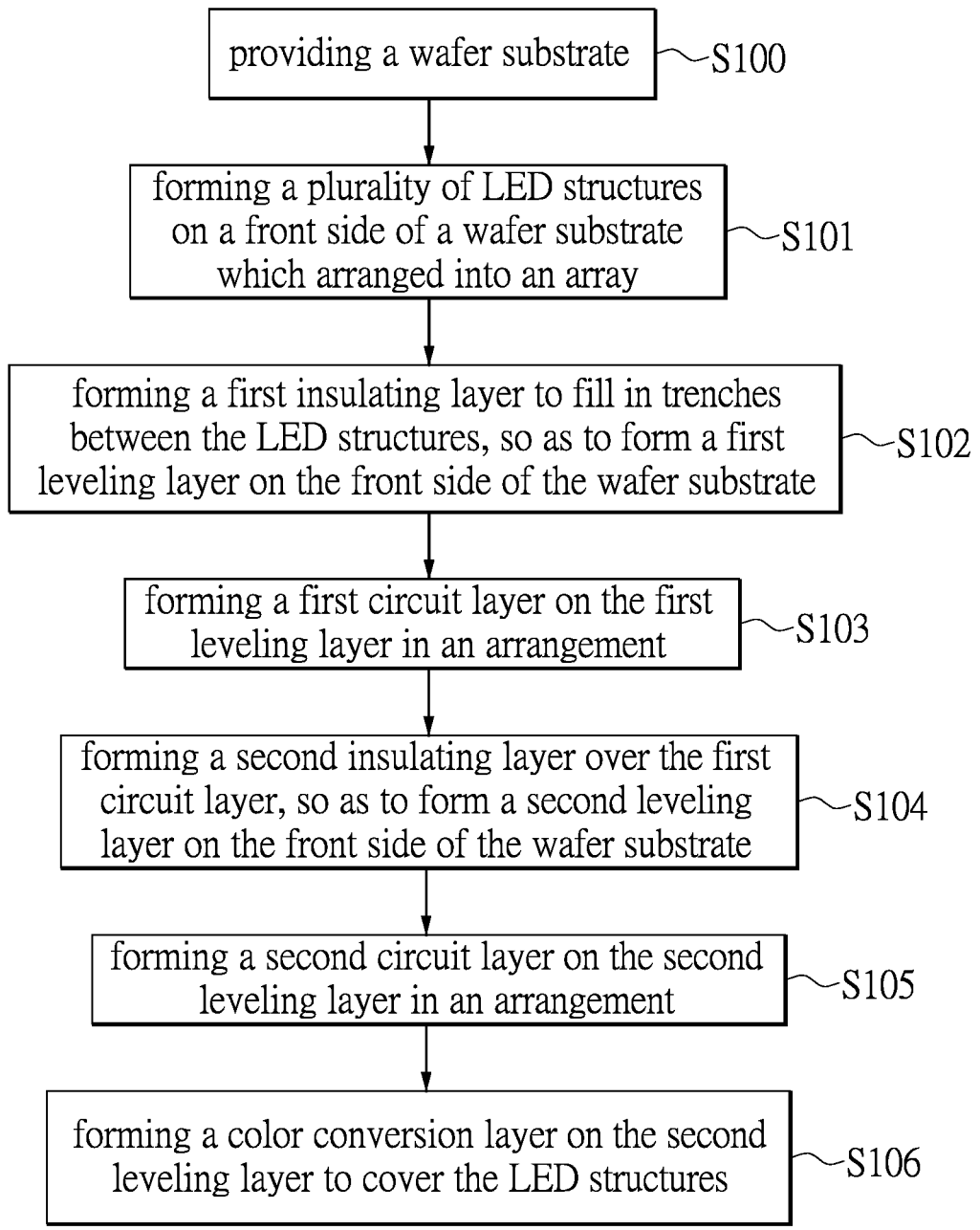
FIG. 1 is a flowchart of a method for manufacturing a wafer-level full-color display device of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

Referring to FIG. 1, process steps of a method for manufacturing a wafer-level full-color display device according to embodiments of the present disclosure are shown. As shown in FIG. 1, the method of the present disclosure for manufacturing the wafer-level full-color display device at least includes: step S100, providing a wafer substrate; step S101, forming a plurality of LED structures on a front side of a wafer substrate which are arranged into an array; step S102, forming a first insulating layer to fill in trenches between the LED structures, so as to form a first leveling layer on the front side of the wafer substrate; step S103, forming a first circuit layer on the first leveling layer in an arrangement; step S104, forming a second insulating layer over the first circuit layer, so as to form a second leveling layer on the front side of the wafer substrate; and step S105, forming a second circuit layer on the second leveling layer in an arrangement.

Figure 2:
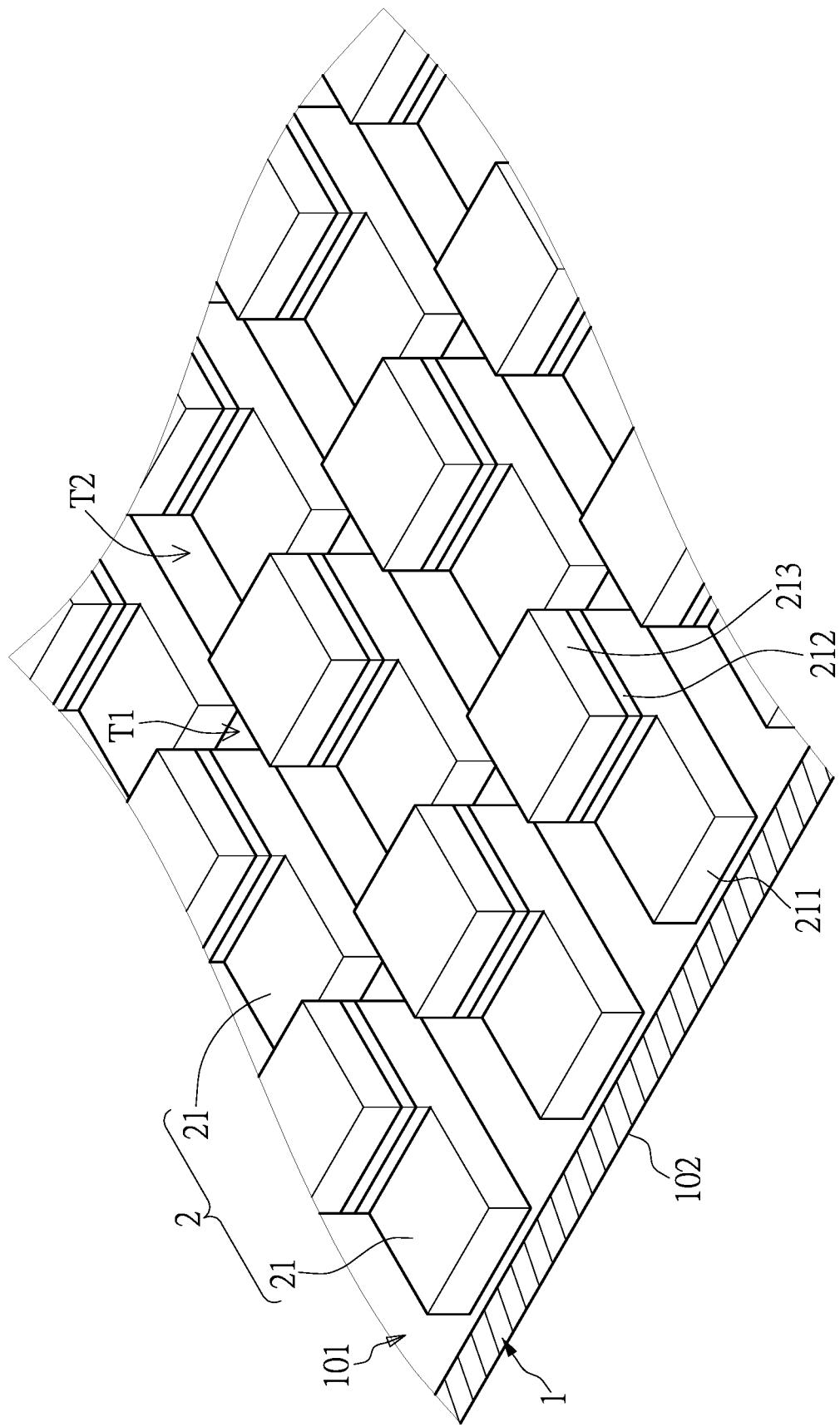
FIG. 2 is a schematic view showing step S100 and step S101 of the method for manufacturing the wafer-level full-color display device of the present disclosure.

Reference is made to FIG. 2. In step S100, the wafer substrate 1 is used as an epitaxial substrate that can be a sapphire wafer substrate, a silicon wafer substrate, a silicon carbide wafer substrate, or a gallium nitride wafer substrate, but such examples are not intended to limit the present disclosure. The wafer substrate 1 has a display area and a peripheral area that is an area other than the display area. The display area can be an area for disposing pixel elements. The peripheral area can be an area for disposing driver components and surrounds the display area.

In step S101, an epitaxial structure is grown on a front side 101 of the wafer substrate 1 and then patterned to form an LED array 2. The epitaxial structure can be formed by metal organic chemical vapor deposition (MOCVD) or molecular beam epitaxy (MBE) and patterned by exposure, development, and etching, but the present disclosure is not limited thereto.

More specifically, the LED array 2 includes a plurality of LED structures 21. Each of the LED structures 21 includes a first conductive structure 211, a light emitting layer 212, and a second conductive structure 213 that are arranged from bottom to top. In the LED array 2, two or more of the LED structures 21 that are in the same row are alternately arranged with a plurality of first trenches T1 (e.g., transversal trenches), and two or more of the LED structures 21 that are in the same column are alternately arranged with a plurality of second trenches T2 (e.g., longitudinal trenches). That is, any adjacent two of the LED structures 21 are spaced apart from each other by one of the first trenches T1 or second trenches T2.

Figure 4:
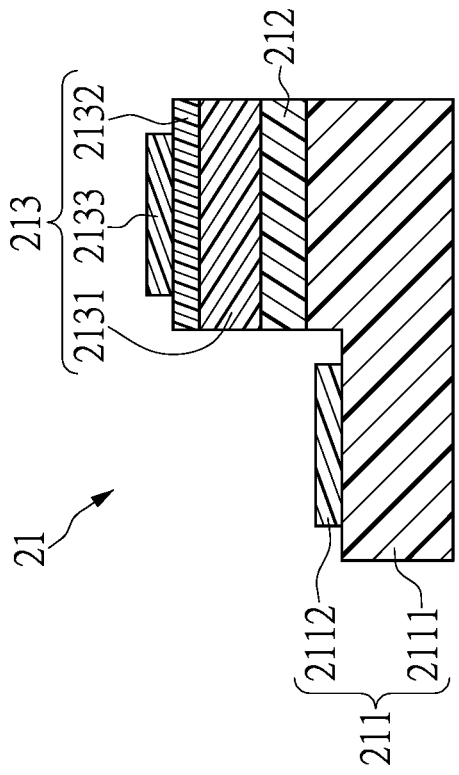
FIG. 4 is a schematic view of another one kind of LED structure formed in step S101 of the method for manufacturing the wafer-level full-color display device of the present disclosure.
Figure 3:
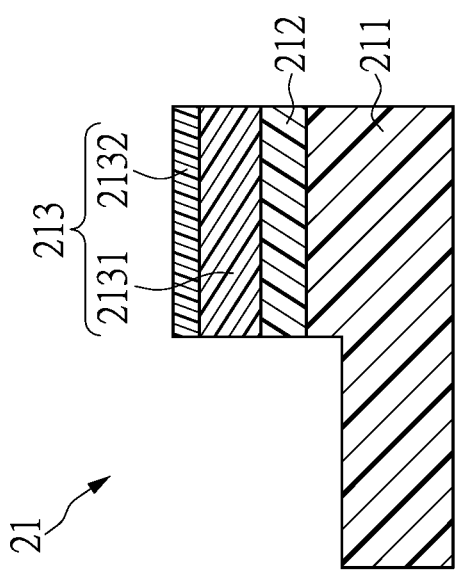
FIG. 3 is a schematic view of one kind of LED structure formed in step S101 of the method for manufacturing the wafer-level full-color display device of the present disclosure.

Reference is made to FIG. 3 and FIG. 4. In practice, the first conductive structure 211 can be a first conductive type semiconductor layer such as an N-type gallium nitride semiconductor layer. Alternatively, the first conductive structure 211 can include a first conductive type semiconductor layer 2111 and a first electrode 2112 formed on the first conductive type semiconductor layer 2111. The light emitting layer 212 can be a quantum well light emitting layer. The second conductive structure 213 can include a second conductive type semiconductor layer 2131 such as a P-type gallium nitride semiconductor layer and a transparent conductive layer 2132 such as an indium tin oxide (ITO) transparent conductive layer. Alternatively, in addition to the second conductive type semiconductor layer 2131 and the transparent conductive layer 2132, the second conductive structure 213 can further include a second electrode 2133 formed on the transparent conductive layer 2132. However, the above description is for exemplary purposes only and is not intended to limit the scope of the present disclosure. According to particular requirements, before the growth of the epitaxial structure, a buffer layer of aluminum nitride or gallium nitride can be formed on the front side 201 of the wafer substrate 1, so as to increase a degree of lattice matching.

Figure 5:
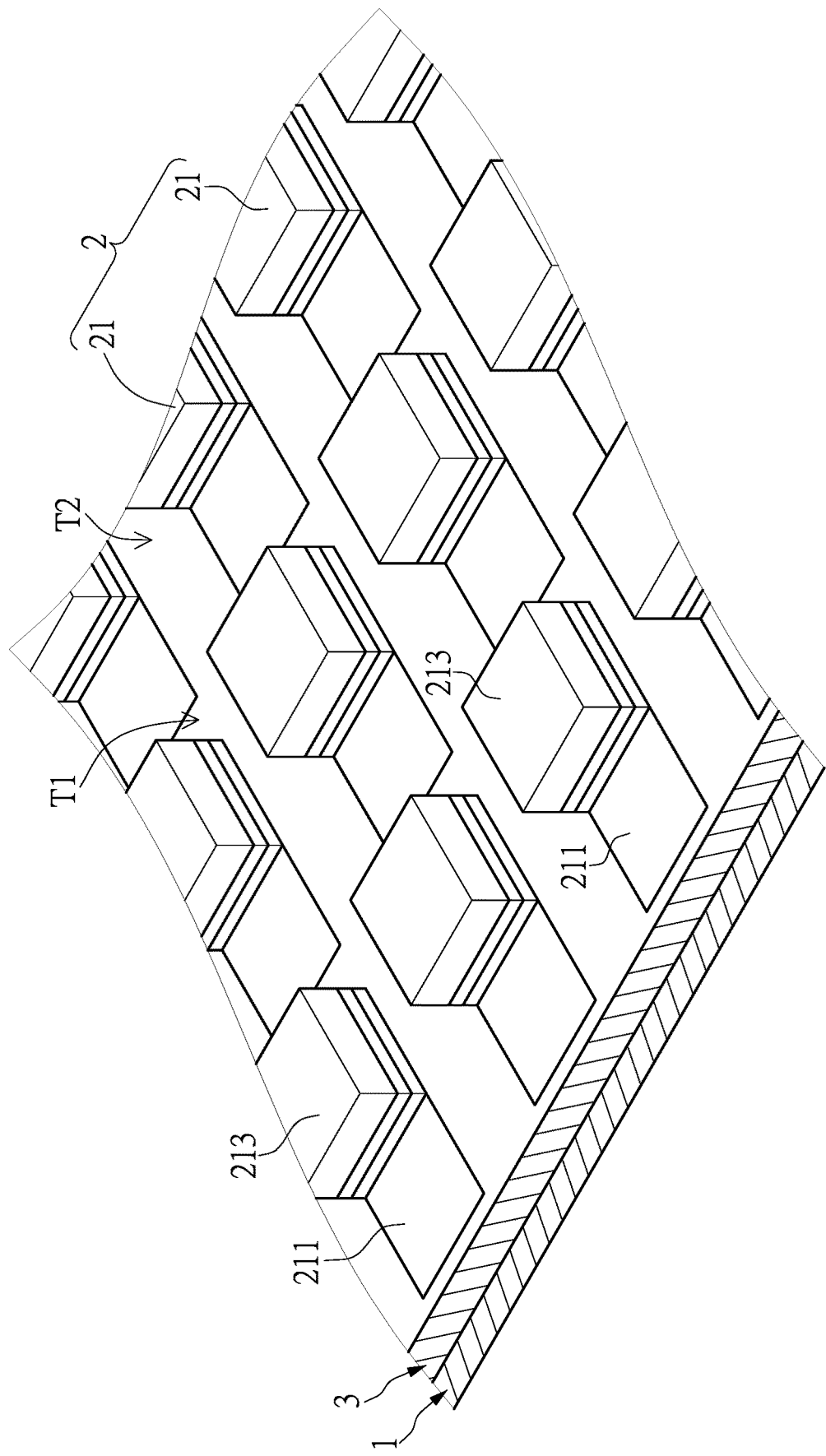
FIG. 5 is a schematic view showing step S102 of the method for manufacturing the wafer-level full-color display device of the present disclosure.
Figure 7:
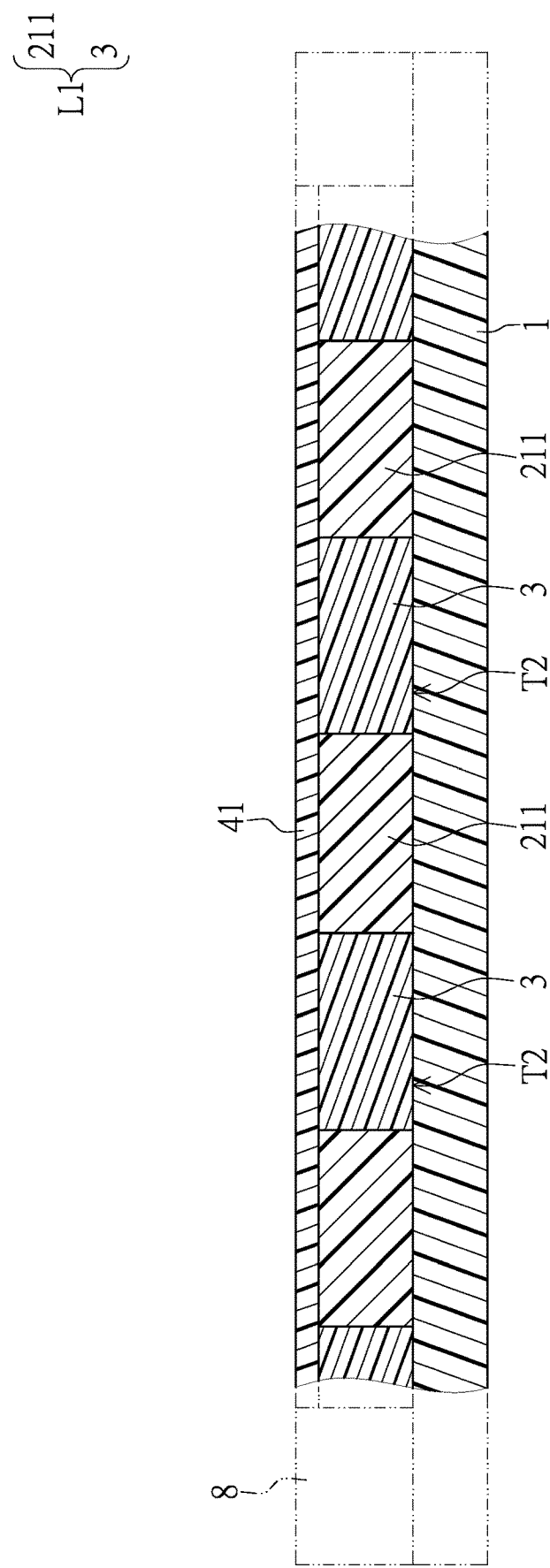
FIG. 7 is a schematic cross-sectional view taken along line VII-VII of FIG. 6.

Reference is made to FIG. 5 and FIG. 7. In step S102, the first insulating layer 3 can be filled into the first trenches T1 and the second trenches T2 until its height is substantially equal to the height of the first conductive structures 211 of the LED structures 21, but the present disclosure is not limited thereto. Accordingly, the surface of the first insulating layer 3 is flush or approximately flush with the surfaces of the first conductive structures 211 of the LED structures 21. Depending on different process capabilities, the first insulating layer 3 can be filled into the first trenches T1 and the second trenches T2 until its height exceeds the height of the first conductive structures 211 of the LED structures 21, and a portion thereof with an excess height is then removed.

It is worth mentioning that the first insulating layer 3 can maintain the LED structures 21 well isolated from each other, and can compensate the height difference between the LED structures 21 and the underlying wafer substrate 1. That is, the first conductive structures 211 of the LED structures 21 and the first insulating layer 3 can jointly form a first leveling layer L1 having a substantially flat surface (i.e., having no or only a few surface height difference) on the wafer substrate 1, as shown in FIG. 7, so as to avoid the climbing of the conductive lines and greatly reducing the probability of a line break. In practice, the first insulating layer 3 can be formed from a photoresist or other materials such as silicon oxide and silicon nitride, preferably a photoresist, but such examples are not intended to limit the present disclosure.

In certain embodiments, each of the first conductive structures 211 of the LED structures 21 does not include the first electrode 2112, and the height of the first insulating layer 3 is substantially equal to the height of the first conductive structures 211 of the LED structures 21, i.e., the surface of the first insulating layer 3 is flush or approximately flush with the surfaces of the first conductive type semiconductor layers 2111 of the first conductive structures 211. In certain embodiments, each of the first conductive structures 211 of the LED structures 21 includes the first electrode 2112, and the height of the first insulating layer 3 is substantially equal to the height of the first conductive structures 211 of the LED structures 21, i.e., the surface of the first insulating layer 3 is flush or approximately flush with the surfaces of the first electrodes 2112 of the first conductive structures 211.

Figure 6:
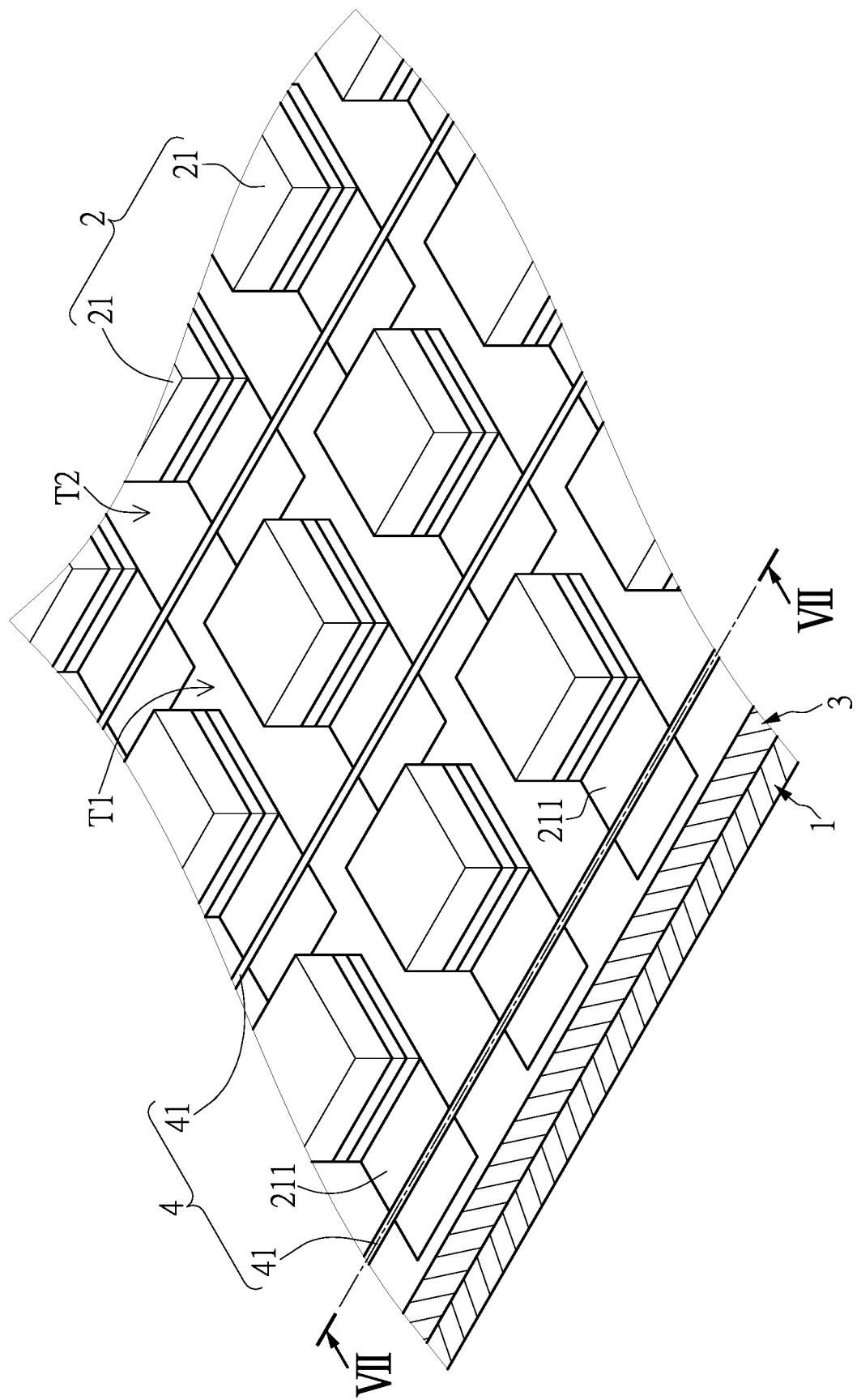
FIG. 6 is a schematic view showing step S103 of the method for manufacturing the wafer-level full-color display device of the present disclosure.

Reference is made to FIG. 6 and FIG. 7. In step S103, the first circuit layer 4 includes a plurality of first conductive lines 41, and in the LED array 2, the first conductive structures 211 of the LED structures 21 of each row or column can be electrically connected to one of the first conductive lines 41. It is worth mentioning that in the method of the present disclosure, a peripheral electrode layer 8 can be formed on the front side 101 of the wafer substrate 1 and located in the peripheral area before the growth of the epitaxial structure. Afterwards, when the first circuit layer 4 is formed, the LED array 2 can be electrically connected to the peripheral electrode layer 8 via the first circuit layer 4, in which the first conductive lines 41 are connected to the peripheral electrode layer 8 and can be configured as scanning lines or signal lines. This will be described in detail later.

Figure 11:
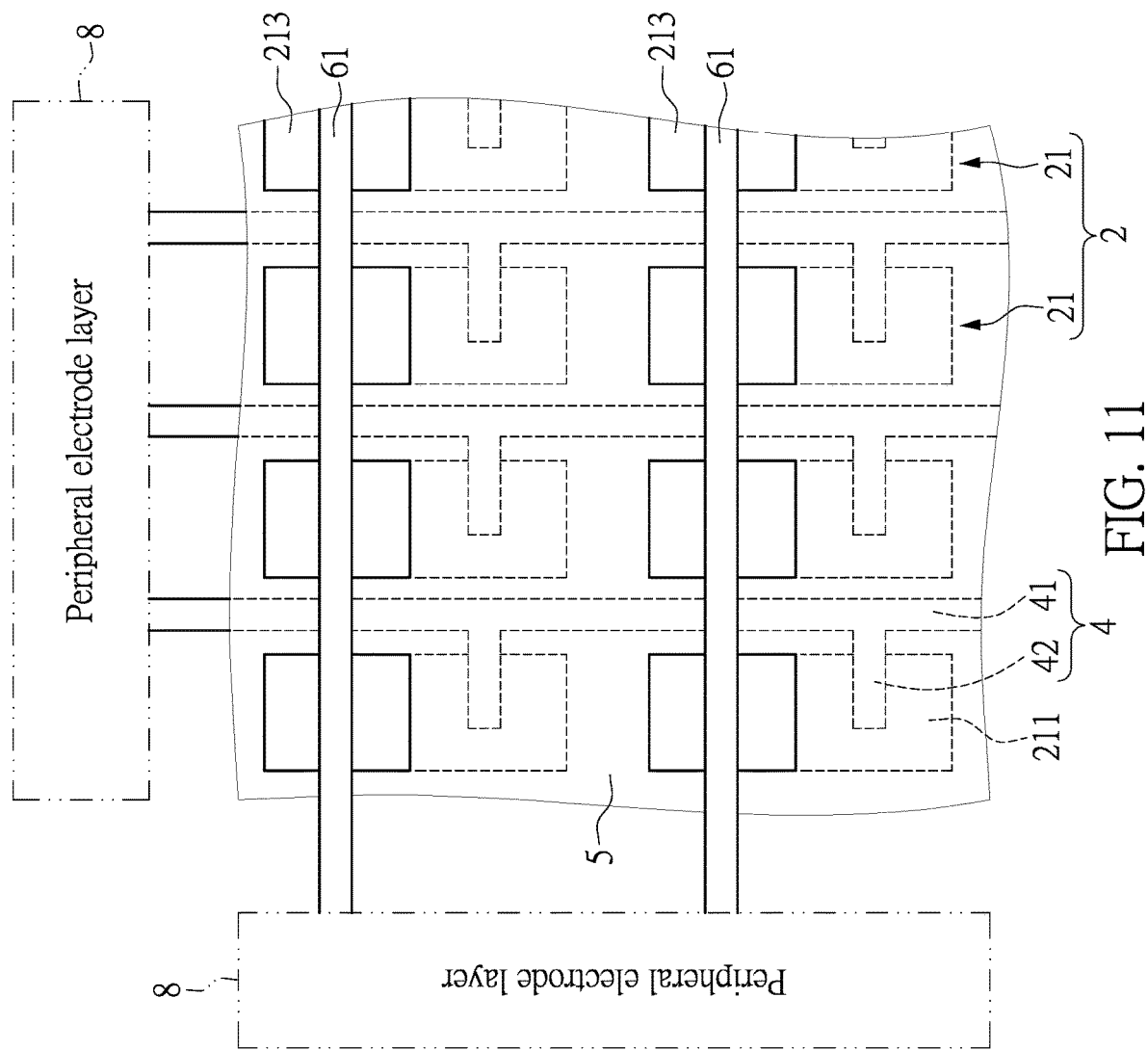
FIG. 11 to FIG. 14 are schematic views showing different circuit configurations of an LED array according to the method for manufacturing the wafer-level full-color display device of the present disclosure.
Figure 12:
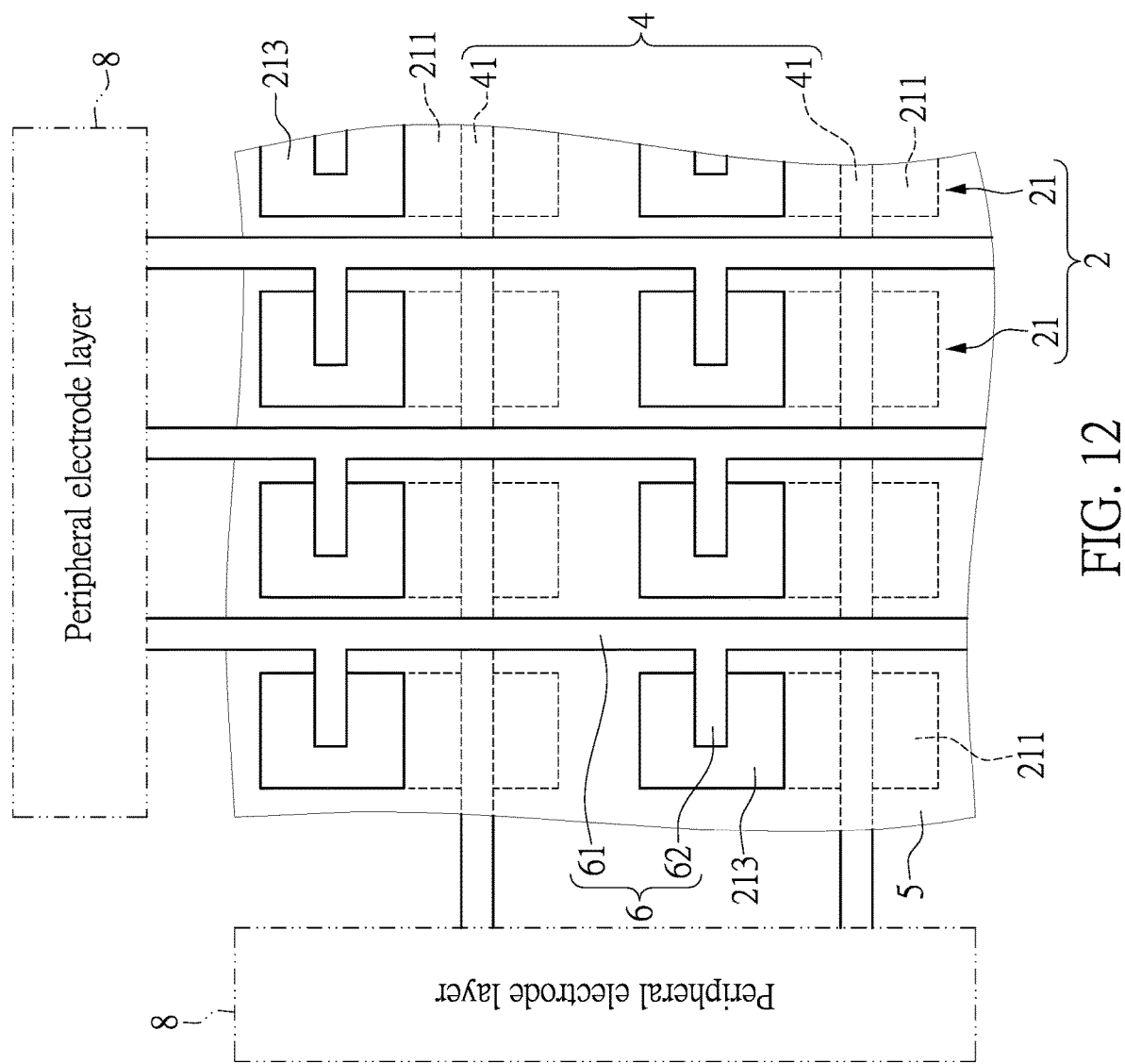
Figure 13:
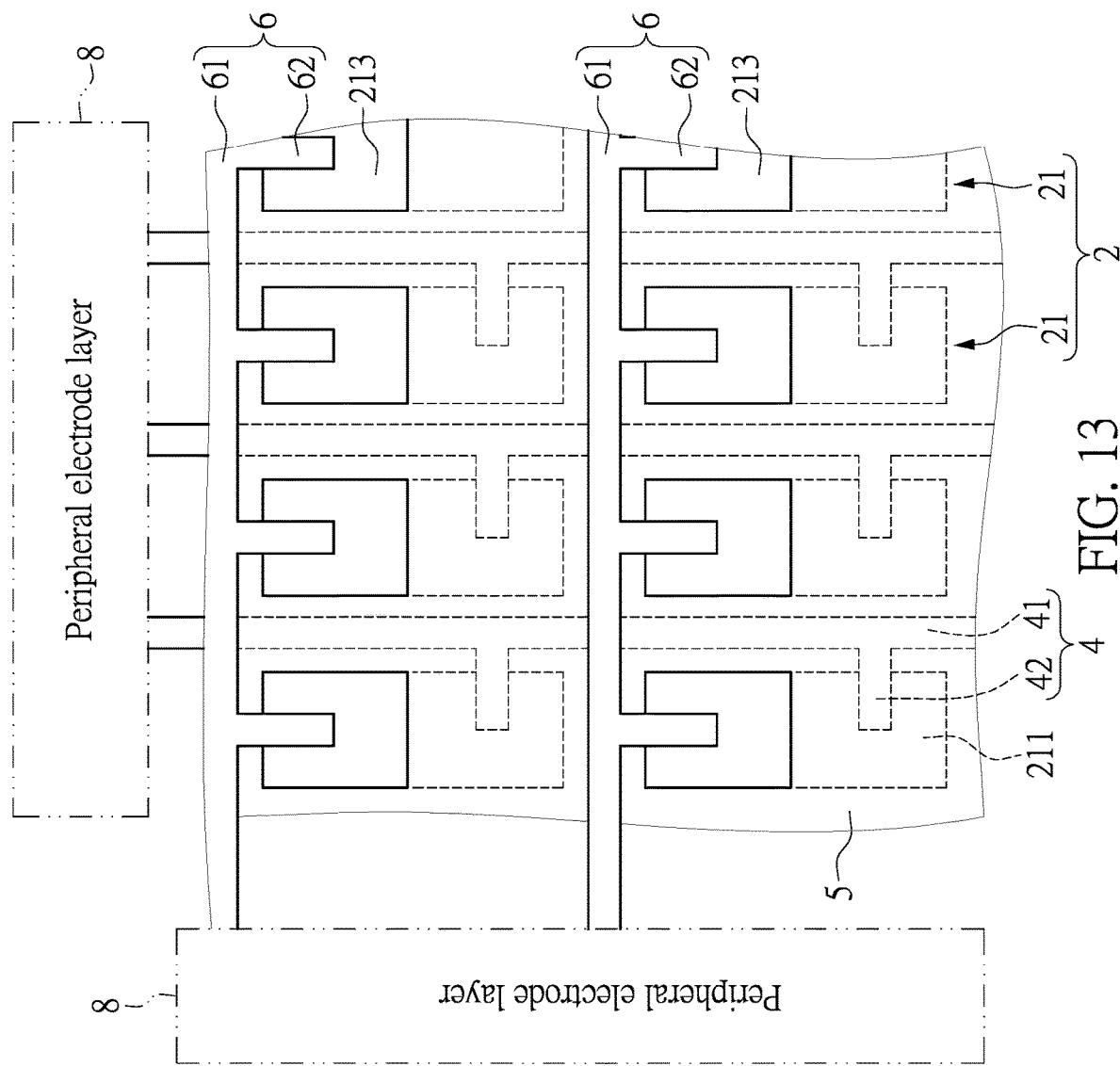

Reference is made to FIG. 11 to FIG. 13. In the present disclosure, the first circuit layer 4 can be formed to drive the LED array by a common cathode or anode configuration, in which the orthogonal projection of the first conductive lines 41 on the wafer substrate 1 may partially overlap or have no overlap with the orthogonal projection of the LED structures 21 on the wafer substrate 1. In certain embodiments, as shown in FIG. 6 and FIG. 12, each of the first conductive lines 41 can be disposed over and electrically connected to the first conductive structures 211 of the LED structures 21 that are in a corresponding column. In certain embodiments, as shown in FIG. 11 and FIG. 13, the first circuit layer 4 further includes a plurality of first leading lines 42 that are connected between the LED structures 21 and the first conductive lines 41. The first conductive lines 41 can be disposed over the first insulating layer 3 and correspond in position to the second trenches T2 along the vertical direction. The first conductive structure 211 of each of the LED structures 21 is electrically connected to a corresponding one of the first conductive lines 41 via a corresponding one of the first leading lines 42. However, the above description is for exemplary purposes only and is not intended to limit the scope of the present disclosure.

Figure 8:
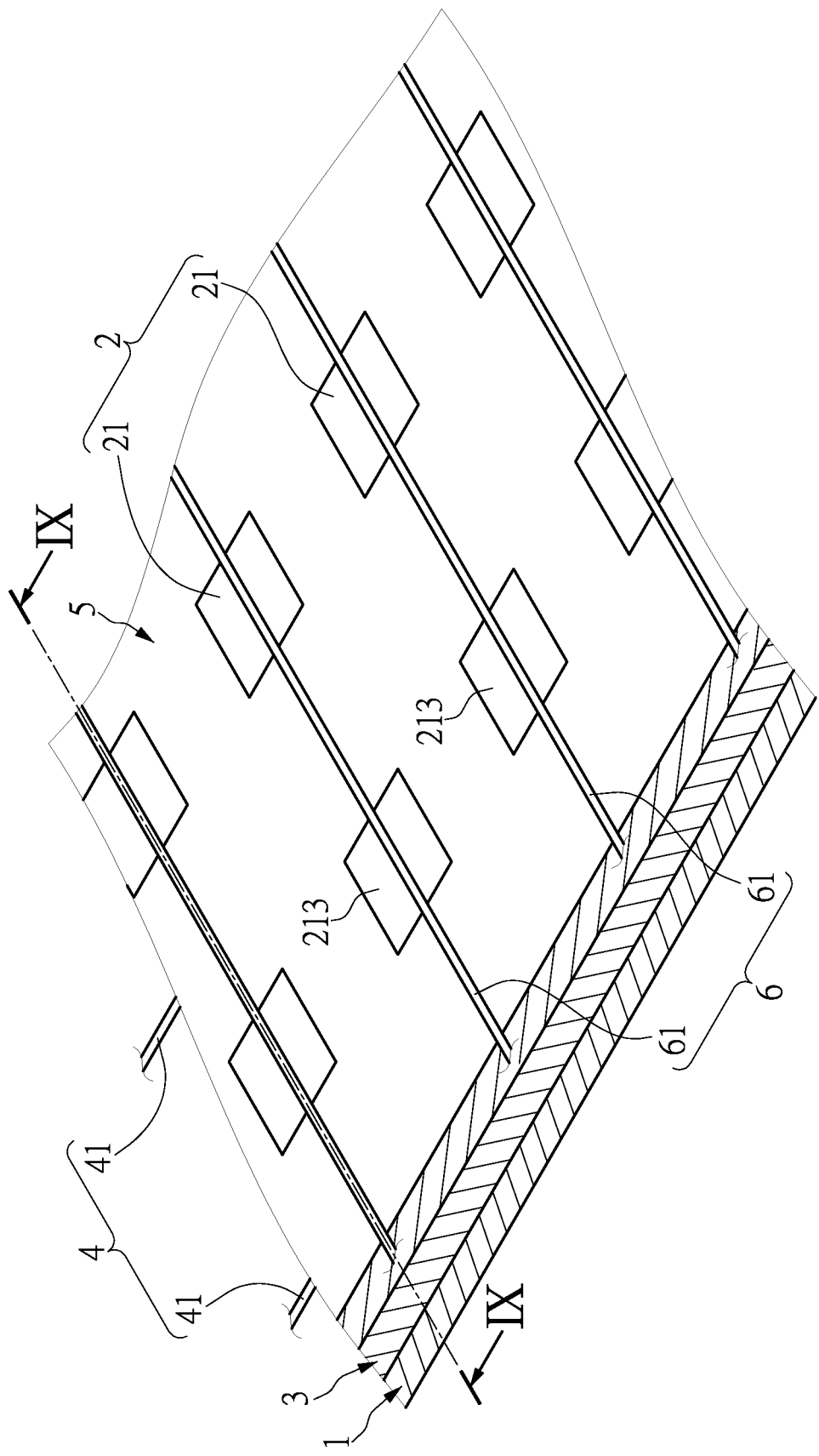
FIG. 8 is a schematic view showing step S104 and step S105 of the method for manufacturing the wafer-level full-color display device of the present disclosure.
Figure 9:
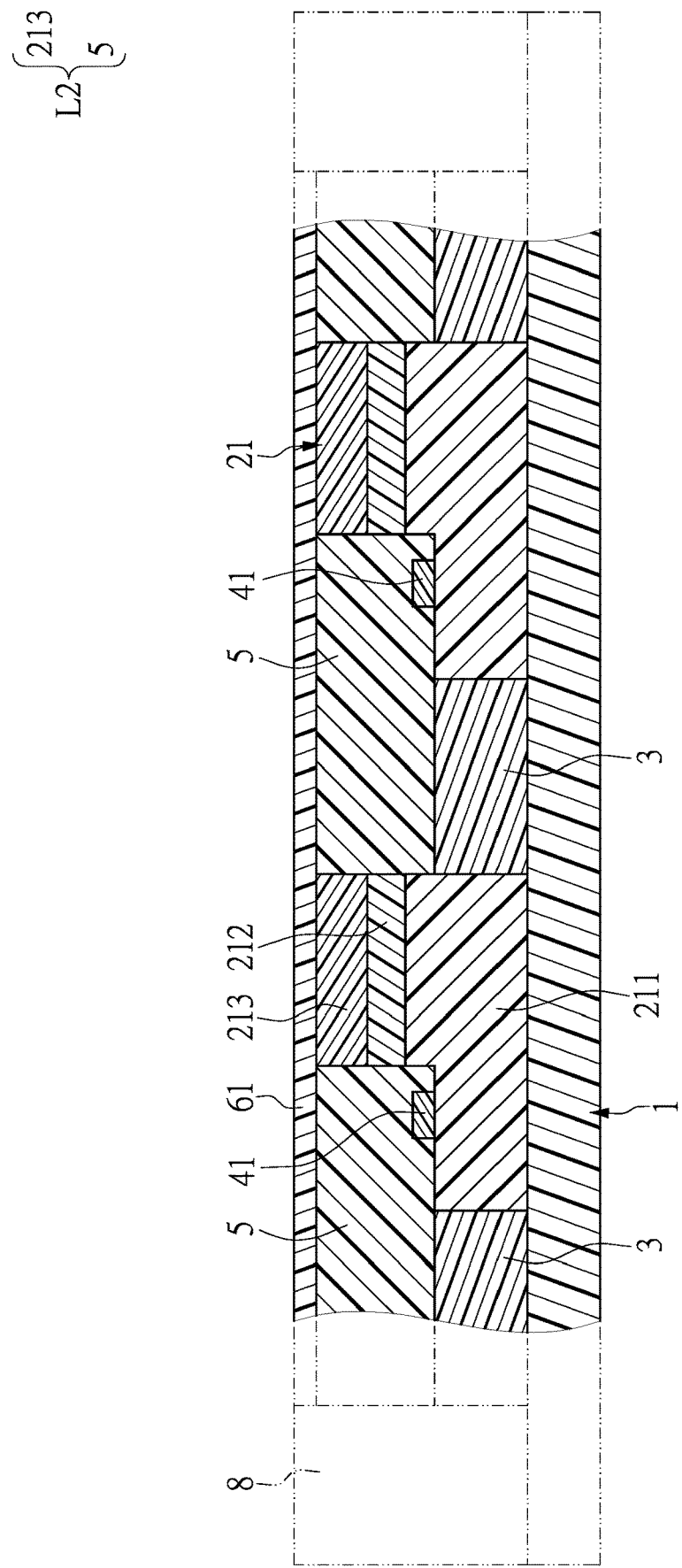
FIG. 9 is a schematic cross-sectional view taken along line IX-IX of FIG. 8.

Reference is made to FIG. 8 and FIG. 9. In step S104, the second insulating layer 5 can be formed over the first circuit layer 4 until its height is substantially equal to the height of the second conductive structures 213 of the LED structures 21, but the present disclosure is not limited thereto. Accordingly, the surface of the second insulating layer 5 is flush or approximately flush with the surfaces of the second conductive structures 213 of the LED structures 21. Depending on different process capabilities, the second insulating layer 5 can be formed over the first circuit layer 4 until its height exceeds the height of the second conductive structures 213 of the LED structures 21, and a portion thereof with an excess height is then removed.

It is worth mentioning that the second insulating layer 5 can flatten the stepped difference of each of the LED structures 21 (i.e., the height difference between the first conductive structure 211 and the second conductive structure 213). That is, the second conductive structures 213 of the LED structures 21 and the second insulating layer 5 can jointly form a second leveling layer L2 having a substantially flat surface (i.e., having no or a few surface height difference) on the wafer substrate 1, as shown in FIG. 9, so as to avoid the climbing of the conductive lines, so that the probability of a line break is greatly reduced. In practice, the second insulating layer 5 can be formed from a photoresist or other materials such as silicon oxide and silicon nitride, preferably a photoresist, but such examples are not intended to limit the present disclosure.

In certain embodiments, each of the second conductive structures 213 of the LED structures 21 does not include the second electrode 2133, and the height of the second insulating layer 5 is substantially equal to the height of the second conductive structures 213 of the LED structures 21, i.e., the surface of the second insulating layer 5 is flush or approximately flush with the surfaces of the transparent conductive layers 2132 of the second conductive structures 213. In certain embodiments, each of the second conductive structures 213 of the LED structures 21 includes the second electrode 2133, and the height of the second insulating layer 5 is substantially equal to the height of the second conductive structures 213 of the LED structures 21, i.e., the surface of the second insulating layer 5 is flush or approximately flush with the surfaces of the second electrodes 2133 of the second conductive structures 213.

In step S105, the second circuit layer 6 includes a plurality of second conductive lines 61, and in the LED array 2, the second conductive structures 213 of the LED structures 21 of each row or column can be electrically connected to one of the second conductive lines 61. It is worth mentioning that when the second circuit layer 6 is formed, the LED array 2 can be electrically connected to the peripheral electrode layer 8 via the second circuit layer 6, in which the second conductive lines 61 are connected to the peripheral electrode layer 8 and can be configured as scanning lines or signal lines. This will be described in detail later.

Reference is made to FIG. 11 to FIG. 13. In the present disclosure, the second circuit layer 6 can be formed to drive the LED array by a common cathode or anode configuration, in which the orthogonal projection of the second conductive lines 61 on the wafer substrate 1 may partially overlap or have no overlap with the orthogonal projection of the LED structures 21 on the wafer substrate 1. More specifically, when each of the first conductive lines 41 is disposed over the first conductive structures 211 of the LED structures 21, the second conductive lines 61 can be arranged in the following way. As shown in FIG. 8, each of the second conductive lines 61 is disposed over and electrically connected to the second conductive structures 213 of the LED structures 21 that are in a corresponding row. Alternatively, as shown in FIG. 12, the second circuit layer 6 further includes a plurality of second leading lines 62, the second conductive lines 61 are disposed over the second insulating layer 5 and correspond in position to the second trenches T2 along the vertical direction, and the second conductive structure 213 of each of the LED structures 21 is electrically connected to a corresponding one of the second conductive lines 61 via a corresponding one of the second leading lines 62.

Furthermore, when the first conductive lines 41 are disposed over the first insulating layer 3 and correspond in position to the second trenches T2 along the vertical direction, the second conductive lines 61 can be arranged in the following way. As shown in FIG. 11, each of the second conductive lines 61 is disposed over and electrically connected to the second conductive structures 213 of the LED structures 21 that are in a corresponding row. Alternatively, as shown in FIG. 13, the second circuit layer 6 further includes a plurality of second leading lines 62, the second conductive lines 61 are disposed over the second insulating layer 5 and correspond in position to the first trenches T1 along the vertical direction, and the second conductive structure 213 of each of the LED structures 21 is electrically connected to a corresponding one of the second conductive lines 61 via a corresponding one of the second leading lines 62. However, the above description is for exemplary purposes only and is not intended to limit the scope of the present disclosure.

Figure 14:
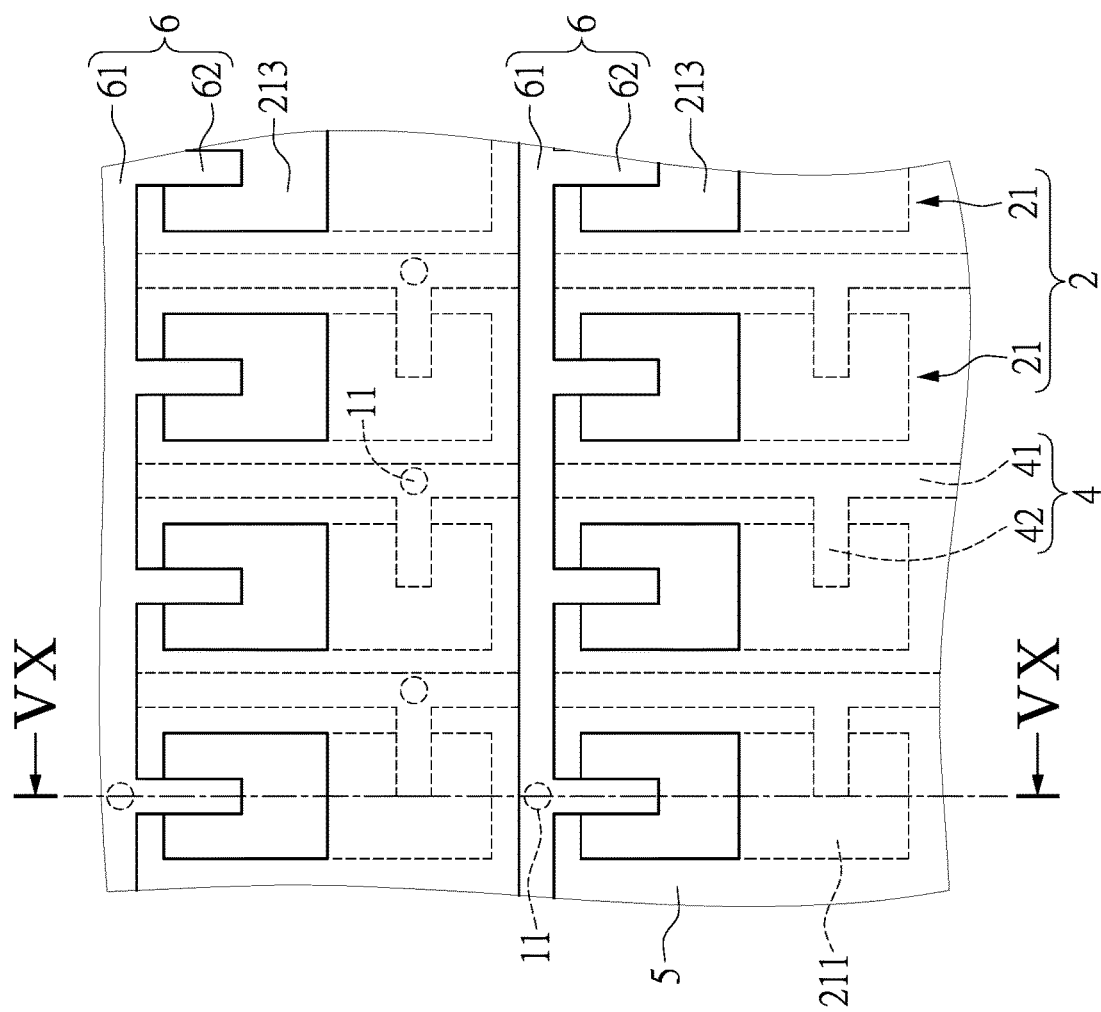
Figure 15:
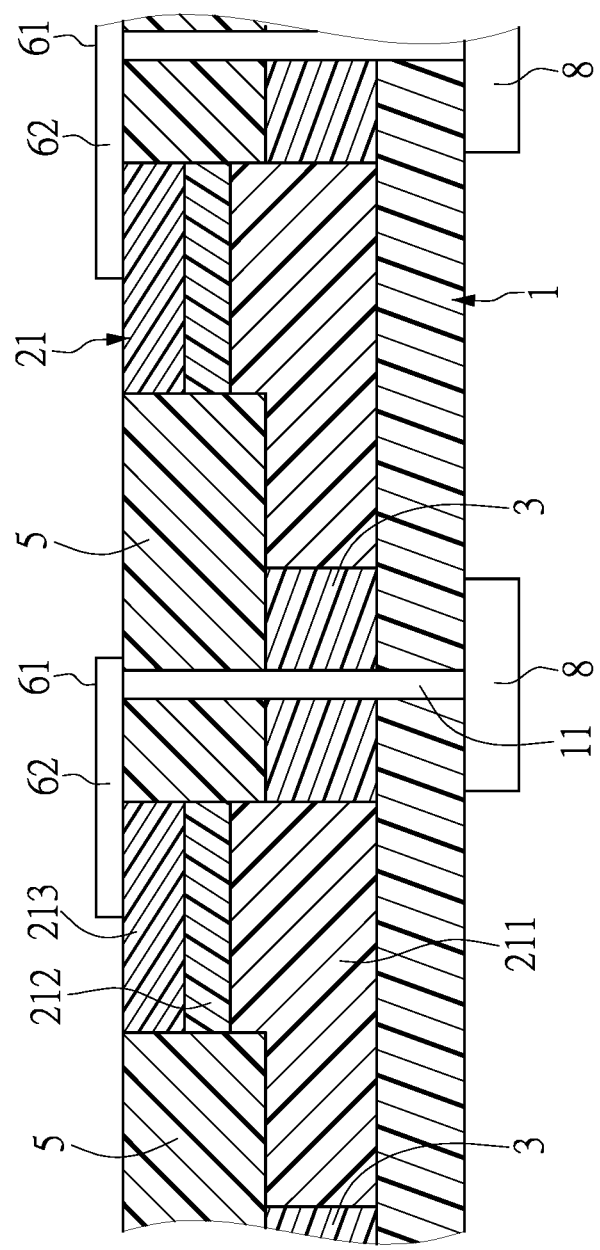
FIG. 15 is a schematic cross-sectional view taken along line XV-XV of FIG. 14.

Reference is made to FIG. 14 and FIG. 15. It is worth mentioning that in the method of the present disclosure, a peripheral electrode layer 8 can be formed on the back side 102 of the wafer substrate 1 and located in the peripheral area before the growth of the epitaxial structure, and a plurality of conductive through holes 11 can be formed in the wafer substrate 1 which pass through the front side 101 and the back side 102. Afterwards, when the first circuit layer 4 is formed, the LED array 2 can be electrically connected to the peripheral electrode layer 8 via the first conductive lines 41 and a first group of the conductive through holes 11, and when the second circuit layer 6 is formed, the LED array 2 can be electrically connected to the peripheral electrode layer 8 via the second conductive lines 61 and a second group of the conductive through holes 11. Therefore, the splicing gaps between display screens can be significantly reduced or even eliminated, so as to a large size seamless display effect. In practice, the conductive through holes 11 can further penetrate the first insulating layer 3, or penetrate the first insulating layer 3 and the second insulating layer 5. However, the above description is for exemplary purposes only and is not intended to limit the scope of the present disclosure.

Figure 10:
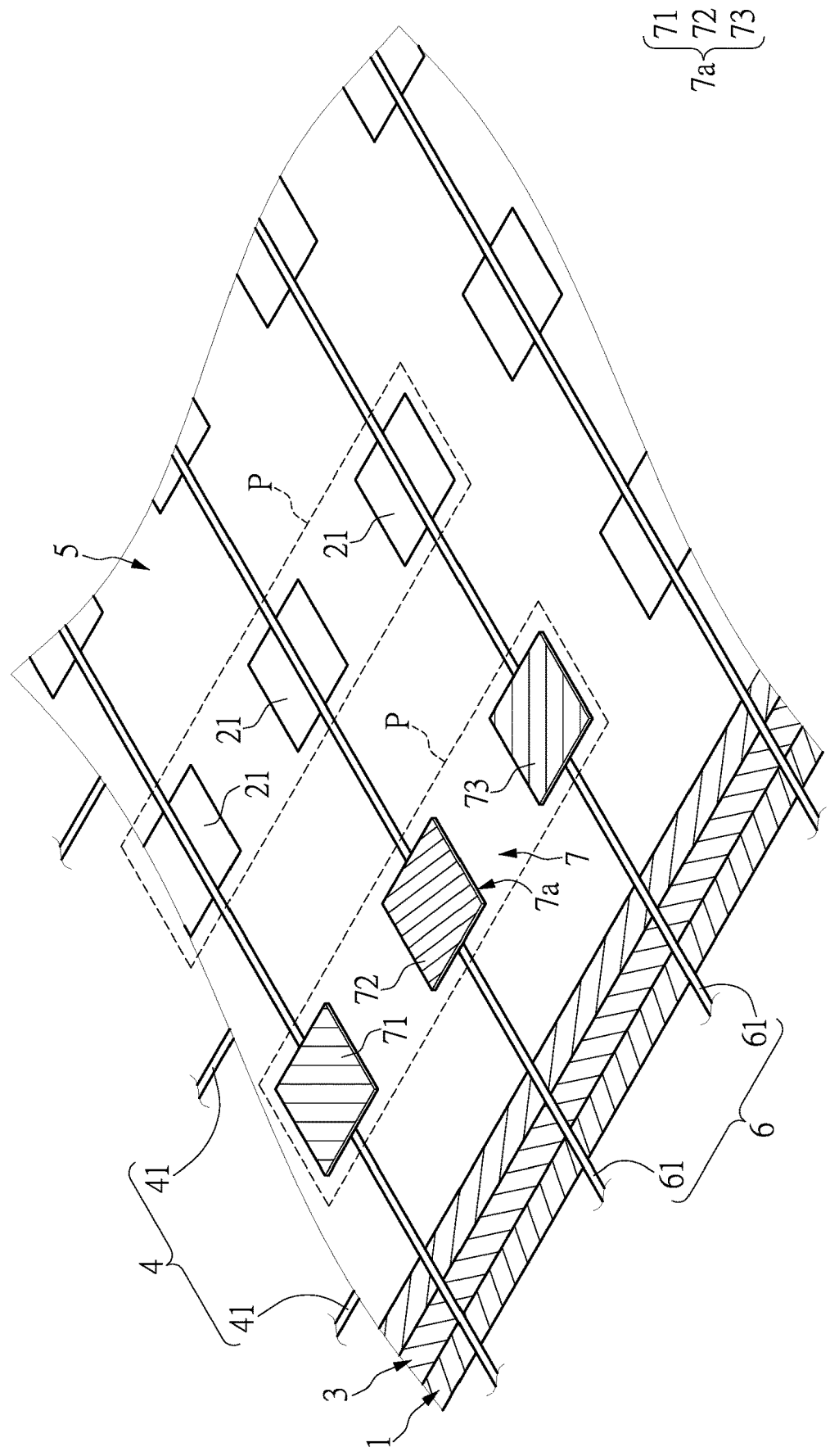
FIG. 10 is a schematic view showing step S106 of the method for manufacturing the wafer-level full-color display device of the present disclosure.

Referring again to FIG. 1, which is to be read in conjunction with FIG. 10, the method of the present disclosure for manufacturing the wafer-level full-color display device can further include a step of forming a color conversion layer on the second leveling layer to cover the LED structures (step S106). More specifically, the color conversion layer 7 can includes a plurality of color conversion components 7a. Each of the color conversion components 7a includes a red conversion sheet 71, a green conversion sheet 72, and a colorless transparent sheet 73. Furthermore, in the LED array 2, three of the LED structures 21 that are in the same row or column and adjacent to each other can be grouped into one of a plurality of pixel units P, and the color conversion components 7a of the color conversion layer 7 correspond in position to the pixel units P along the vertical direction. The red conversion sheet 71, the green conversion sheet 72, and the colorless transparent sheet 73 of each of the color conversion components 7a respectively cover the three of the LED structures of the corresponding pixel unit P. In practice, the LED structures 21 are configured to emit blue light. The red conversion sheet 71 can contain a red phosphor or quantum dot material or other wavelength conversion substances that can convert blue light to red light. The green conversion sheet 72 can contain a green phosphor or quantum dot material or other wavelength conversion substances that can convert blue light to green light. However, such examples are not intended to limit the present disclosure.

The wafer-level full-color display device Manufactured by the method of the present disclosure can include a wafer substrate 1, an LED array 2, a first insulating layer 3, a first circuit layer 4, a second insulating layer 5, and a second circuit layer 6. As shown in FIG. 7, FIG. 9 and FIG. 10, the wafer substrate 1 has a front side 101 and a back side 102. The LED array 2 is disposed on the front side 101 of the wafer substrate 1 and includes a plurality of LED structures 21. Each of the LED structures 21 includes a first conductive structure 211, a light emitting layer 212, and a second conductive structure 213 that are arranged from bottom to top. Furthermore, two or more of the LED structures 21 that are in the same row are alternately arranged with a plurality of first trenches T1, and two or more of the LED structures 21 that are in the same column are alternately arranged with a plurality of second trenches T2. The first insulating layer 3 is filled in the first trenches T1 and the second trenches T2. The first insulating layer 3 and the first conductive structures 211 of the LED structures 21 jointly form a first leveling layer L1 on the front side 101 of the wafer substrate 1. The first circuit layer 4 is disposed on the first leveling layer L1 and electrically connected to the first conductive structures 211 of the LED structures 21. The second insulating layer 5 is disposed over the first circuit layer 4. The second insulating layer 5 and the second conductive structures 213 of the LED structures 21 jointly form a second leveling layer L2 on the front side 101 of the wafer substrate 1. The second circuit layer 6 is disposed on the second leveling layer L2 and electrically connected to the second conductive structures 213 of the LED structures 21.

In conclusion, in the wafer-level full-color display device and the method for manufacturing the same provided by the present disclosure, by virtue of "a first insulating layer being formed to fill in trenches (e.g., longitudinal and transversal trenches) between LED structures, so as to form a first leveling layer on a front side of a wafer substrate," "a first circuit layer being arranged on the first leveling layer," "a second insulating layer being formed over the first circuit layer, so as to form a second leveling layer on the front side of the wafer substrate," and "a second circuit layer being arranged on the second leveling layer," the stepped difference of each of the LED structure can be leveled and the height difference between the LED structures and the wafer substrate can be filled up, so as to prevent conductive lines from being broken due to climbing, thereby increasing the yield and reliability of products (i.e., wafer-level full-color display devices manufactured by the method).

The method for manufacturing the wafer-level full-color display device of the present disclosure can select either of the conductive lines of the first circuit layer or the second circuit layer (i.e., the lines connected to the first conductive structures or the second conductive structures) to serve as signal lines, thereby having high flexibility in circuit design and configuration. Furthermore, the method for manufacturing the wafer-level full-color display device of the present disclosure can omit one or more steps required for transferring the LED structures, and is thus advantageous for reducing production costs and increasing production efficiency.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A method for manufacturing a wafer-level full-color display device, comprising:
   providing a wafer substrate having a front side and a back side;
   forming an LED array on the front side of the wafer substrate, the LED array including a plurality of LED structures, wherein two or more of the LED structures that are in a same row are alternately arranged with a plurality of first trenches, and two or more of the LED structures that are in a same column are alternately arranged with a plurality of second trenches, and wherein each of the LED structures includes a first conductive structure, a light emitting layer, and a second conductive structure that are arranged from bottom to top;
   forming a first insulating layer to fill the first trenches and the second trenches, wherein the first insulating layer and the first conductive structures of the LED structures jointly form a first leveling layer on the front side of the wafer substrate;
   forming a first circuit layer on the first leveling layer, the first circuit layer being electrically connected to the first conductive structures of the LED structures;
   forming a second insulating layer over the first circuit layer, wherein the second insulating layer and the second conductive structures of the LED structures jointly form a second leveling layer on the front side of the wafer substrate; and
   forming a second circuit layer on the second leveling layer, the second circuit layer being electrically connected to the second conductive structures of the LED structures.

2. The method according to claim 1, wherein the first circuit layer includes a plurality of first conductive lines, and each of the first conductive lines is disposed over the first conductive structures of the LED structures that are in a corresponding column; wherein the second circuit layer includes a plurality of second conductive lines, and each of the second conductive lines is disposed over the second conductive structures of the LED structures that are in a corresponding row.

3. The method according to claim 1, wherein the first circuit layer includes a plurality of first conductive lines and a plurality of first leading lines, the first conductive lines correspond in position to the second trenches along the vertical direction, and the first conductive structure of each of the LED structures is electrically connected to a corresponding one of the first conductive lines via a corresponding one of the first leading lines; wherein the second circuit layer includes a plurality of second conductive lines, and each of the second conductive lines is disposed over the second conductive structures of the LED structures that are in a corresponding column.

4. The method according to claim 1, wherein the first circuit layer includes a plurality of first conductive lines, and each of the first conductive lines is disposed over the first conductive structures of the LED structures that are in a corresponding column; wherein the second circuit layer includes a plurality of second conductive lines and a plurality of second leading lines, the second conductive lines correspond in position to the second trenches along the vertical direction, and the second conductive structure of each of the LED structures is electrically connected to a corresponding one of the second conductive lines via a corresponding one of the second leading lines.

5. The method according to claim 1, wherein the first circuit layer includes a plurality of first conductive lines and a plurality of first leading lines, the first conductive lines correspond in position to the second trenches along the vertical direction, and the first conductive structure of each of the LED structures is electrically connected to a corresponding one of the first conductive lines via a corresponding one of the first leading lines; wherein the second circuit layer includes a plurality of second conductive lines and a plurality of second leading lines, the second conductive lines correspond in position to the first trenches along the vertical direction, and the second conductive structure of each of the LED structures is electrically connected to a corresponding one of the second conductive lines via a corresponding one of the second leading lines.

6. The method according to claim 1, wherein the step of providing the wafer substrate further includes: forming a peripheral electrode layer on the front side of the wafer substrate; wherein the wafer substrate has a display area and a peripheral area surrounding the display area, the LED array is formed in the display area, and the peripheral electrode layer is formed in the peripheral area and electrically connected to the LED array via the first circuit layer and the second circuit layer.

7. The method according to claim 2, wherein in the step of forming the first circuit layer on the first leveling layer, the first conductive lines are formed to be electrically connected to the peripheral electrode layer, and in the step of forming the second circuit layer on the second leveling layer, the second conductive lines are formed to be electrically connected to the peripheral electrode layer.

8. The method according to claim 1, wherein the step of providing the wafer substrate further includes: forming a plurality of conductive through holes passing through the front side and the back side of the wafer substrate; and forming a peripheral electrode layer on the back side of the wafer substrate; wherein in the step of forming the first circuit layer on the first leveling layer, the first conductive lines are formed to be electrically connected to the peripheral electrode layer via a first group of the conductive through holes, and in the step of forming the second circuit layer on the second leveling layer, the second conductive lines are formed to be electrically connected to the peripheral electrode layer via a second group of the conductive through holes.

9. The method according to claim 1, further comprising: forming a color conversion layer to cover the second conductive structures of the LED structures.

10. The method according to claim 9, wherein three of the LED structures that are in the same row or column and adjacent to each other are grouped into a pixel unit, and each of a plurality of color conversion components of the color conversion layer includes a red conversion sheet, a green conversion sheet, and a colorless transparent sheet that respectively cover the three of the LED structures of a corresponding pixel unit.

11. A wafer-level full-color display device, comprising:
a wafer substrate having a front side and a back side;
an LED array disposed on the front side of the wafer substrate, the LED array including a plurality of LED structures, wherein two or more of the LED structures that are in a same row are alternately arranged with a plurality of first trenches, and two or more of the LED structures that are in a same column are alternately arranged with a plurality of second trenches, and wherein each of the LED structures includes a first conductive structure, a light emitting layer, and a second conductive structure that are arranged from bottom to top;
a first insulating layer filled in the first trenches and the second trenches, wherein the first insulating layer and the first conductive structures of the LED structures jointly form a first leveling layer on the front side of the wafer substrate;
a first circuit layer disposed on the first leveling layer and electrically connected to the first conductive structures of the LED structures;
a second insulating layer disposed over the first circuit layer, wherein the second insulating layer and the second conductive structures of the LED structures jointly form a second leveling layer on the front side of the wafer substrate; and
a second circuit layer disposed on the second leveling layer and electrically connected to the second conductive structures of the LED structures.

12. The wafer-level full-color display device according to claim 11, wherein the first circuit layer includes a plurality of first conductive lines, and each of the first conductive lines is disposed over the first conductive structures of the LED structures that are in a corresponding column; wherein the second circuit layer includes a plurality of second conductive lines, and each of the second conductive lines is disposed over the second conductive structures of the LED structures that are in a corresponding row.

13. The wafer-level full-color display device according to claim 11, wherein the first circuit layer includes a plurality of first conductive lines and a plurality of first leading lines, the first conductive lines correspond in position to the second trenches along the vertical direction, and the first conductive structure of each of the LED structures is electrically connected to a corresponding one of the first conductive lines via a corresponding one of the first leading lines; wherein the second circuit layer includes a plurality of second conductive lines, and each of the second conductive lines is disposed over the second conductive structures of the LED structures that are in a corresponding column.

14. The wafer-level full-color display device according to claim 11, wherein the first circuit layer includes a plurality of first conductive lines, and each of the first conductive lines is disposed over the first conductive structures of the LED structures that are in a corresponding column; wherein the second circuit layer includes a plurality of second conductive lines and a plurality of second leading lines, the second conductive lines correspond in position to the second trenches along the vertical direction, and the second conductive structure of each of the LED structures is electrically connected to a corresponding one of the second conductive lines via a corresponding one of the second leading lines.

15. The wafer-level full-color display device according to claim 11, wherein the first circuit layer includes a plurality of first conductive lines and a plurality of first leading lines, the first conductive lines correspond in position to the second trenches along the vertical direction, and the first conductive structure of each of the LED structures is electrically connected to a corresponding one of the first conductive lines via a corresponding one of the first leading lines; wherein the second circuit layer includes a plurality of second conductive lines and a plurality of second leading lines, the second conductive lines correspond in position to the first trenches along the vertical direction, and the second conductive structure of each of the LED structures is electrically connected to a corresponding one of the second conductive lines via a corresponding one of the second leading lines.

16. The wafer-level full-color display device according to claim 11, further comprising a peripheral electrode layer disposed on the front side of the wafer substrate; wherein the wafer substrate has a display area and a peripheral area surrounding the display area, the LED array is disposed in the display area, and the peripheral electrode layer is disposed in the peripheral area and electrically connected to the LED array via the first circuit layer and the second circuit layer.

17. The wafer-level full-color display device according to claim 12, wherein the first conductive lines and the second conductive lines are electrically connected to the peripheral electrode layer.

18. The wafer-level full-color display device according to claim 11, further comprising a peripheral electrode layer disposed on the back side of the wafer substrate, and the wafer substrate has a plurality of conductive through holes passing through the front side and the back side; wherein the first conductive lines are electrically connected to the peripheral electrode layer via a first group of the conductive through holes, and the second conductive lines are electrically connected to the peripheral electrode layer via a second group of the conductive through holes.

19. The wafer-level full-color display device according to claim 11, further comprising a color conversion layer disposed on the second leveling layer to cover the second conductive structures of the LED structures.

20. The wafer-level full-color display device according to claim 19, wherein three of the LED structures that are in the same row or column and adjacent to each other are grouped into a pixel unit, and each of a plurality of color conversion components of the color conversion layer includes a red conversion sheet, a green conversion sheet, and a colorless transparent sheet that respectively cover the three of the LED structures of the corresponding pixel unit.

\* \* \* \* \*